United States Patent
Schneider et al.

(10) Patent No.: US 8,860,062 B2
(45) Date of Patent: Oct. 14, 2014

(54) OPTOELECTRONIC SEMICONDUCTOR COMPONENT

(75) Inventors: Markus Schneider, Nittendorf-Schönhofen (DE); David Racz, Regensburg (DE); Johann Ramchen, Altdorf (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/809,292

(22) PCT Filed: Jun. 16, 2011

(86) PCT No.: PCT/EP2011/060043
§ 371 (c)(1),
(2), (4) Date: Mar. 4, 2013

(87) PCT Pub. No.: WO2012/007245
PCT Pub. Date: Jan. 19, 2012

(65) Prior Publication Data
US 2013/0207145 A1    Aug. 15, 2013

(30) Foreign Application Priority Data
Jul. 15, 2010 (DE) .......................... 10 2010 027 253

(51) Int. Cl.
*H01L 33/60* (2010.01)
*H01L 33/50* (2010.01)
*H01L 33/62* (2010.01)
*H01L 33/46* (2010.01)
*H01L 33/20* (2010.01)

(52) U.S. Cl.
CPC ............. *H01L 33/60* (2013.01); *H01L 33/50* (2013.01); *H01L 33/62* (2013.01); *H01L 33/46* (2013.01); *H01L 33/20* (2013.01); *H01L 2924/1715* (2013.01); *H01L 2224/48465* (2013.01); *H01L 2224/48227* (2013.01)
USPC .............. 257/98; 257/432; 257/433; 257/666

(58) Field of Classification Search
CPC ................ H01L 2924/00; H01L 2224/48247; H01L 2224/73265; H01L 2224/48091; H01L 2224/48465; H01L 2924/00014
USPC ......................................... 257/432–433, 666
See application file for complete search history.

(56) References Cited

U.S. PATENT DOCUMENTS

| 6,900,511 B2 | 5/2005 | Ruhnau et al. |
| 2004/0089898 A1 | 5/2004 | Ruhnau et al. |

(Continued)

FOREIGN PATENT DOCUMENTS

| DE | 102 45 946 C1 | 10/2003 |
| DE | 102 29 067 A1 | 1/2004 |

(Continued)

OTHER PUBLICATIONS

Japanese Examination Report dated Jan. 6, 2014 for Japanese Application No. 2013-519007.

*Primary Examiner* — David Vu
*Assistant Examiner* — Jonathan Han
(74) *Attorney, Agent, or Firm* — DLA Piper LLP (US)

(57) ABSTRACT

An optoelectronic semiconductor component includes a carrier with a carrier top, at least one optoelectronic semiconductor chip mounted on the carrier top and having a radiation-transmissive substrate and a semiconductor layer sequence which includes at least one active layer that generates electromagnetic radiation, and a reflective potting material, wherein, starting from the carrier top, the potting material surrounds the semiconductor chip in a lateral direction at least up to half the height of the substrate.

10 Claims, 5 Drawing Sheets

(56) References Cited

U.S. PATENT DOCUMENTS

| | | |
|---|---|---|
| 2004/0089989 A1 | 5/2004 | Tewani et al. |
| 2005/0167790 A1* | 8/2005 | Khor et al. ............... 257/666 |
| 2005/0242355 A1 | 11/2005 | Guenther et al. |
| 2007/0023873 A1* | 2/2007 | Park et al. ............... 257/666 |
| 2007/0228932 A1 | 10/2007 | Amano et al. |
| 2008/0218072 A1* | 9/2008 | Haruna et al. ............ 313/506 |
| 2010/0140648 A1* | 6/2010 | Harada et al. ............. 257/98 |

FOREIGN PATENT DOCUMENTS

| | | |
|---|---|---|
| DE | 10 2004 021 233 A1 | 12/2005 |
| JP | 2002-43625 | 2/2002 |
| JP | 2004-165308 | 6/2004 |
| JP | 2007-250629 | 9/2007 |
| WO | 2007/072659 A1 | 6/2007 |
| WO | 2008/069671 A1 | 6/2009 |

* cited by examiner

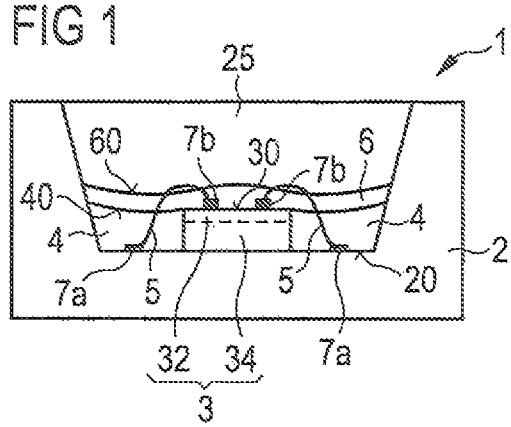
FIG 1
FIG 2
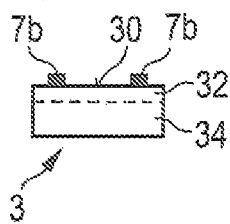
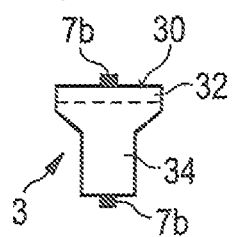
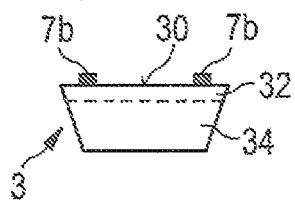
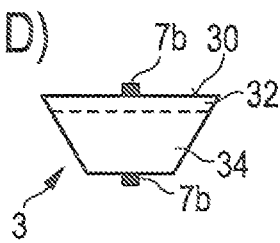
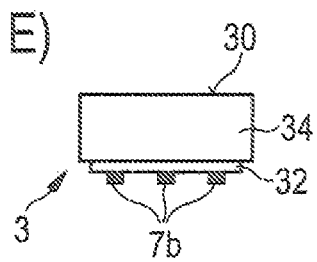
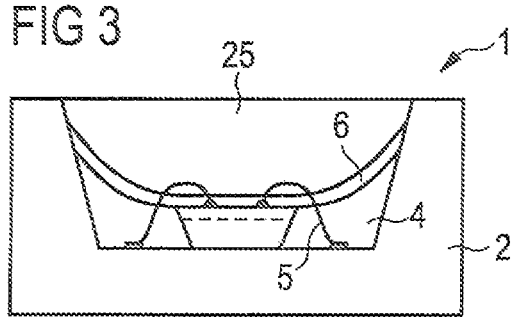
FIG 3

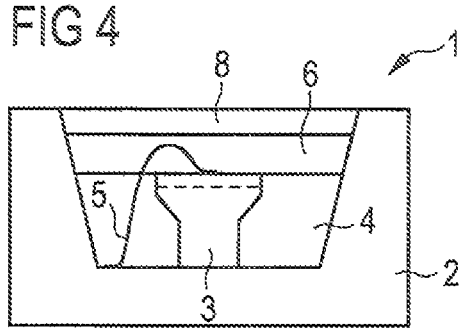
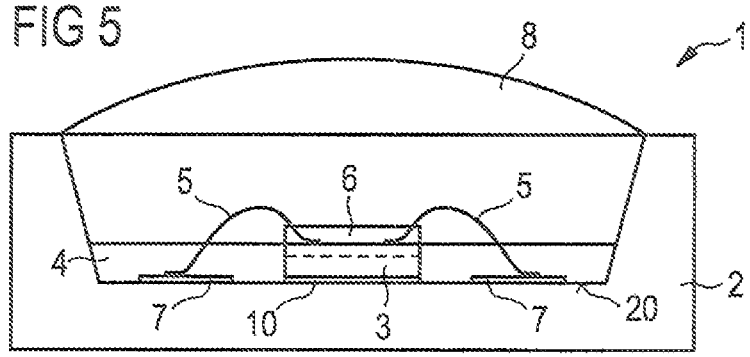
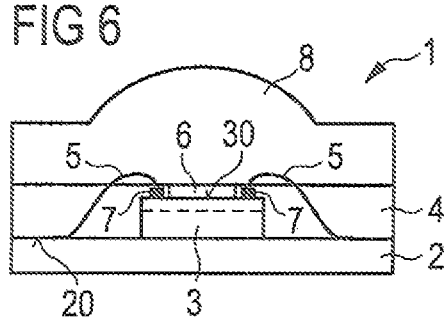
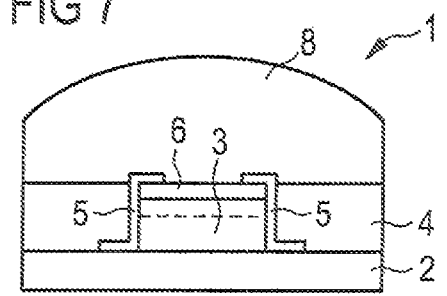

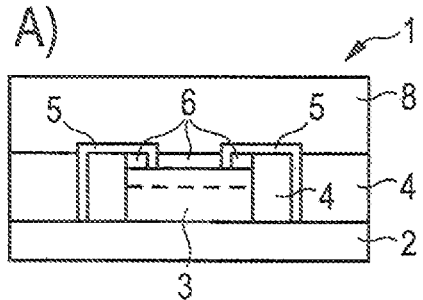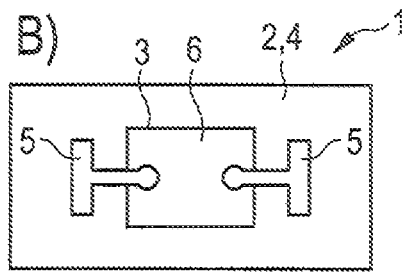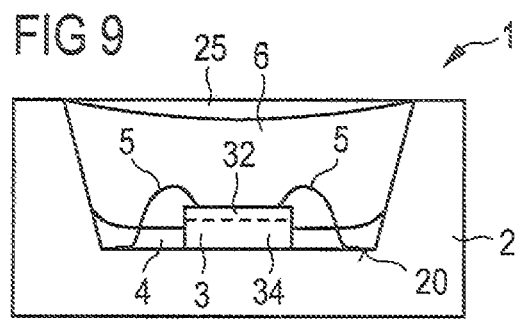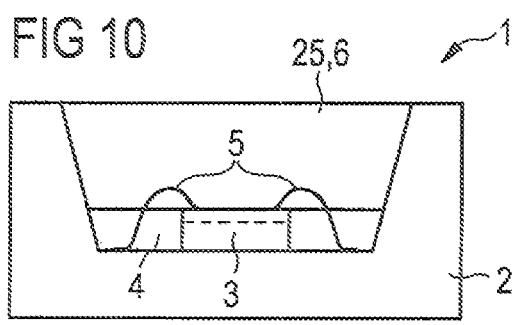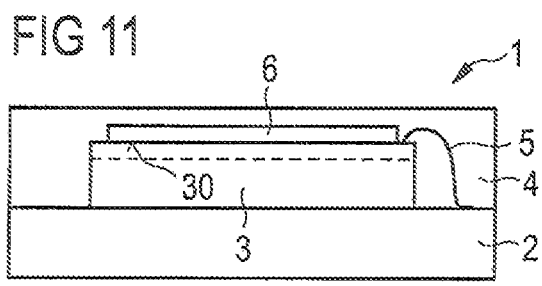

FIG 12
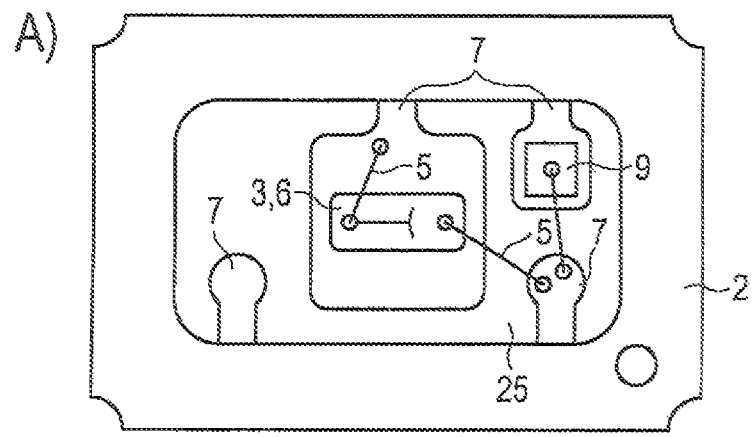
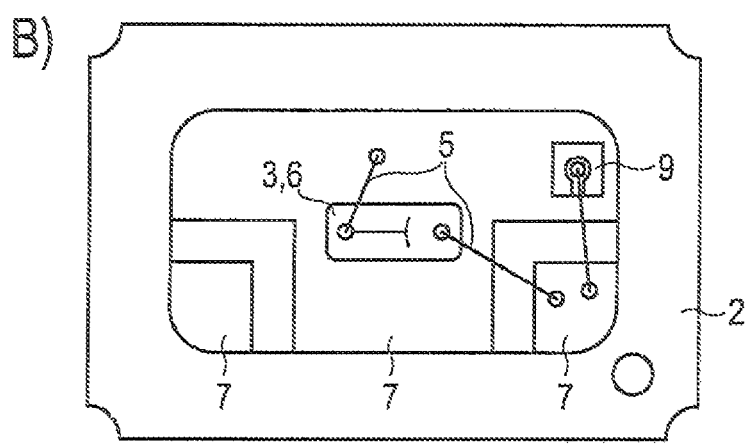
FIG 13
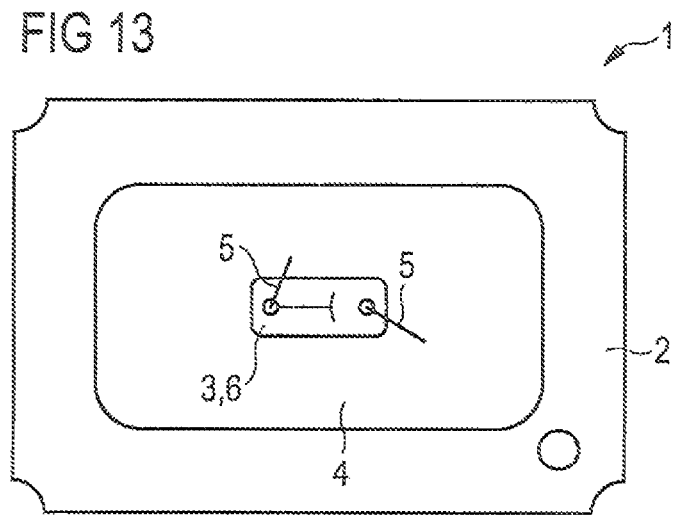

US 8,860,062 B2

OPTOELECTRONIC SEMICONDUCTOR COMPONENT

RELATED APPLICATIONS

This is a §371 of International Application No. PCT/EP2011/060043, with an international filing date of Jun. 16, 2011 (WO 2012/007245 A1, published Jan. 19, 2012), which is based on German Patent Application No. 10 2010 027 253.1, filed Jul. 15, 2010, the subject matter of which is incorporated herein by reference.

TECHNICAL FIELD

This disclosure relates to an optoelectronic semiconductor component.

BACKGROUND

U.S. Pat. No. 6,900,511 B2 discloses an optoelectronic component and a production method for that purpose. It could nonetheless be helpful to provide an optoelectronic semiconductor component which exhibits high emission efficiency.

SUMMARY

We provide an optoelectronic semiconductor component including a carrier with a carrier top, at least one optoelectronic semiconductor chip mounted on the carrier top and having a radiation-transmissive substrate and a semiconductor layer sequence which includes at least one active layer that generates electromagnetic radiation, and a reflective potting material, wherein, starting from the carrier top, the potting material surrounds the semiconductor chip in a lateral direction at least up to half the height of the substrate.

We also provide an optoelectronic semiconductor component including a carrier with a carrier top, at least one optoelectronic semiconductor chip mounted on the carrier top and having a radiation-transmissive substrate and a semiconductor layer sequence which includes at least one active layer that generates electromagnetic radiation, and a reflective potting material, wherein 1) the potting material surrounds the semiconductor chip in a lateral direction, 2) in a direction away from the carrier top, terminates flush with the semiconductor chip, 3) a fraction of the radiation generated in the semiconductor chip when in operation leaves the substrate in the lateral direction and penetrates by at most 300 µm into the potting material, and 4) the potting material reflects at least some of the fraction of radiation diffusely back into the substrate.

BRIEF DESCRIPTION OF THE DRAWINGS

FIGS. 1, 3 to 11 and 13 are schematic representations of examples of optoelectronic semiconductor chip.

FIG. 2 is a schematic side view of optoelectronic semiconductor chips for examples of semiconductor chips.

FIG. 12 is a schematic representation of semiconductor components without potting material.

DETAILED DESCRIPTION

Figure 14:
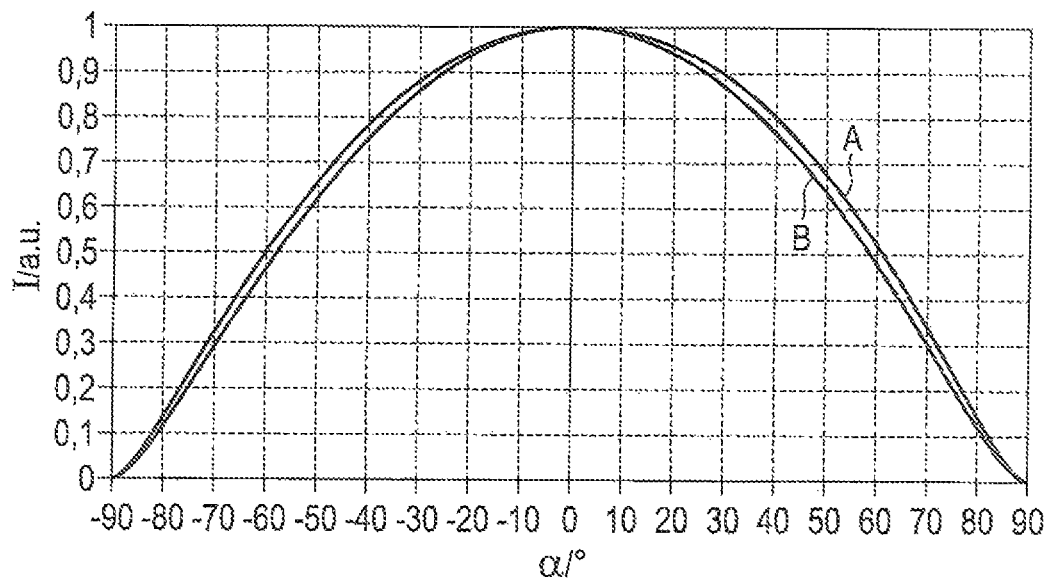
FIGS. 14 and 15 are schematic diagrams relating to emission characteristics of examples of semiconductor components.

The optoelectronic semiconductor component may contain a carrier with a carrier top. The carrier, for example, comprises a circuit board, in particular a printed circuit board and/or a metal core printed circuit board. The carrier may likewise comprise a ceramic preferably provided with conductor tracks or a passivated semiconductor material such as silicon or germanium provided with conductor tracks. The carrier may moreover take the form of a "Quad-Flat No-Leads Package," QFN for short.

The semiconductor component may comprise one or more optoelectronic semiconductor chips mounted on the carrier top. The semiconductor chip comprises a semiconductor layer sequence which comprises at least one active layer that generates electromagnetic radiation. The at least one semiconductor chip furthermore comprises a radiation-transmissive substrate which is preferably transparent and clear. The substrate may be a growth substrate for the semiconductor layer sequence. It is likewise possible for the growth substrate to be removed from the semiconductor layer sequence and for the substrate of the semiconductor chip to be a subsequently applied substrate which carries the semiconductor layer sequence and differs from the growth substrate. The semiconductor layer sequence and/or the preferably transparent substrate may at least in places be surrounded, in particular directly, by a radiation-transmissive passivation layer.

The semiconductor layer sequence of the semiconductor chip is preferably based on a III-V compound semiconductor material. The semiconductor material is, for example, a nitride compound semiconductor material such as $Al_nIn_{1-n}Ga_mN$ or a phosphide compound semiconductor material such as $Al_nIn_{1-n}Ga_mP$, wherein in each case $0 \le n \le 1$, $0 \le m \le 1$ and $n+m \le 1$ applies. The semiconductor layer sequence may comprise dopants and additional constituents. For simplicity's sake, however, only the fundamental constituents of the crystal lattice are indicated, i.e., Al, Ga, In, N or P, even if these may in part be replaced and/or supplemented by small quantities of further substances. The active layer in particular contains a pn-junction and/or at least one quantum well structure.

The semiconductor component may comprise a reflective potting material. Reflective means that the potting material exhibits a reflectivity of in particular more than 80% or of more than 90%, more preferably of more than 94% for radiation in the visible spectral range. The potting material preferably reflects diffusely. The potting material preferably appears white to an observer.

The reflective potting material may surround the semiconductor chip in a lateral direction. In particular, the surrounding potting material is at least in places in direct contact with the semiconductor chip.

The potting material may extend in a direction away from the carrier top at least up to half the height of the substrate of the semiconductor chip. In particular, lateral boundary faces of the semiconductor chip are covered at least to half the height of the substrate by the reflective potting material. In other words, the semiconductor chip may be embedded in the reflective potting material at least to half the height of the substrate.

The optoelectronic semiconductor chip may be a "volume emitter." In other words, in the absence of additional measures such as the reflective potting material, a fraction of the radiation generated when the semiconductor chip is in operation amounting, for example, to more than 20% or more than 40% of the total radiation coupled out from the semiconductor chip leaves the semiconductor chip via the radiation-transmissive substrate. In the absence of additional measures such as the potting material, when the semiconductor chip is in operation, radiation is thus emitted not only from the semiconductor layer sequence, but also to a substantial extent from the substrate.

The optoelectronic semiconductor component may contain a carrier with a carrier top. At least one optoelectronic semiconductor chip is mounted on the carrier top. The semiconductor chip comprises a semiconductor layer sequence with at least one active layer that generates electromagnetic radiation and a radiation-transmissive substrate. The semiconductor component furthermore comprises a reflective potting material which, starting from the carrier top, surrounds the semiconductor chip in a lateral direction at least up to half the height of the substrate.

Due to their crystal lattice and their elevated thermal conductivity, materials for the substrate such as sapphire or silicon carbide are particularly suitable to have semiconductor layer sequences to generate radiation applied thereto. These materials are, however, radiation-transmissive. Radiation generated when the semiconductor chip is in operation is thus distributed over the entire semiconductor chip, in particular also over the substrate. The radiation generated during operation is therefore also emitted from the semiconductor chip through boundary faces of the substrate. The radiation emitted from the substrate is comparatively undirected and may, for example, be absorbed on the carrier. The reflective potting material, which largely surrounds the substrate, is capable of reflecting the radiation emerging via the substrate back into the substrate. The emission efficiency of the semiconductor component may be increased in this way.

The semiconductor chip may be a light-emitting diode which emits radiation preferably in the near ultraviolet or near infrared spectral range and/or visible light such as blue or white light. The thickness of the semiconductor layer sequence amounts, for example, to at most 12 μm or at most 8 μm. The thickness of the radiation-transmissive substrate preferably is, for example, 40 μm to 500 μm, in particular 50 μm to 200 μm.

The radiation-transmissive substrate may be located between the carrier and the semiconductor layer sequence. The semiconductor layer sequence is thus mounted on the side of the substrate remote from the carrier. The main radiation side of the semiconductor chip is then formed by a boundary face remote from the carrier of the semiconductor layer sequence or of the semiconductor chip.

The semiconductor component, starting from the carrier top, may have the potting material extending at least up to the main radiation side of the semiconductor chip remote from the carrier and/or at least up to a main side of the substrate remote from the carrier. In other words, lateral boundary faces of the semiconductor chip may be covered preferably all round and preferably completely by the reflective potting material.

The semiconductor component may contain a conversion medium. The conversion medium is designed to convert radiation generated when the semiconductor chip is in operation partially or completely into radiation of another wavelength. The conversion medium may be arranged downstream of the semiconductor chip in a direction of emission. For example, the conversion medium at least indirectly covers some or all of the main radiation side in a direction away from the carrier and perpendicular to the carrier top. The conversion medium may be in direct contact with the main radiation side of the semiconductor chip.

The conversion medium may take the form of a layer. This may mean that the lateral extent of the conversion medium exceeds the thickness of the conversion medium. The thickness of the conversion medium is, for example, 10 μm to 150 μm, in particular 15 μm to 50 μm.

The conversion medium may be in places or completely in direct contact in the lateral direction, thus in a direction parallel to the carrier top, with the potting material. The potting material and the conversion medium may directly adjoin one another in the lateral direction.

The potting material and the conversion medium may terminate flush in a direction away from the carrier top. In other words, the tops of the potting material and of the conversion medium remote from the carrier may be at an identical distance from the carrier top in the region in which the potting material and the conversion medium are closest to and/or are in contact with one another in a lateral direction.

The potting material may extend in places or completely over the main radiation side. The main radiation side may thus be covered by the potting material in a direction away from the carrier top. The thickness of the potting material over the carrier top preferably amounts to at most 50 μm or at most 20 μm. It is possible for the potting material to be in direct contact with the main radiation side. Preferably, however, the conversion medium is located between the potting material above the main radiation side and the main radiation side itself. The potting material then covers both the semiconductor chip and the conversion medium.

The semiconductor chip and the potting material may be predominantly or completely covered by the conversion medium in a direction perpendicular to the carrier top. Predominantly may mean that the degree of coverage amounts to more than 75% or more than 90%. In particular, the semiconductor chip and the potting material are completely covered by the conversion medium together with at least one electrical connector. The electrical connector is, for example, formed by a bonding wire which passes through the conversion medium.

The at least one electrical connector may produce an electrical connection between the carrier, in particular the carrier top or electrical connection zones located on the carrier top, and the main radiation side of the semiconductor chip. The connector which connects the carrier to the main radiation side may be embedded at least in places in the reflective potting material, in particular up to the top of the potting material remote from the carrier. In the lateral direction, the potting material may directly and form-fittingly surround the connector.

The potting material directly and form-fittingly may surround the semiconductor chip in the lateral direction. The potting material may be cast onto the semiconductor chip.

One or more electrical connector(s) may be applied in places directly to the top of the potting material and/or of the conversion medium remote from the carrier, for example, by sputtering or deposition from the gas phase. The connector then contains at least one electrically conductive layer. The electrically conductive layer of the connector is preferably connected to the carrier and/or to the semiconductor chip by a via through the potting material and/or through the conversion medium.

A fraction of the radiation generated when the semiconductor chip is in operation may leave the substrate of the semiconductor chip in the lateral direction and penetrate into the potting material. The depth of penetration amounts, for example, to at least 10 μm or at least 30 μm. The depth of penetration preferably amounts to at most 300 μm or at most 100 μm. The depth of penetration is, for example, the depth, parallel to the carrier top, at which the intensity of radiation penetrating into the potting material has declined to $1/e^2$.

The potting material may be designed to reflect at least some of the fraction of radiation penetrating into the potting material diffusely back into the substrate. Some of the radiation thus leaves the substrate and/or the semiconductor layer sequence, penetrates into the potting material, is reflected by the latter and then passes back into the semiconductor chip and is preferably subsequently coupled out of the semiconductor chip on the main radiation side.

The electrical connection zones on the carrier top, which may be located laterally beside the semiconductor chip, may comprise a material which absorbs the radiation generated when the semiconductor chip is in operation. The connection zones are shielded by the potting material from the radiation generated in the semiconductor chip. For example, the connection zones comprise gold and the semiconductor chip emits radiation in the blue spectral range.

The main radiation side and/or the top of the conversion medium may be covered in places or completely with a non-stick layer. The non-stick layer is designed to prevent the potting material from wetting the main radiation side and/or the top of the conversion medium during production of the semiconductor component. The non-stick layer comprises, for example, a fluorinated polymer such as polytetrafluoroethylene.

The potting material may be designed to reduce the emission angle of the radiation generated when the semiconductor component is in operation. This is achieved in that the potting material reduces or prevents a fraction of the radiation generated in the semiconductor chip from leaving the latter in a lateral direction. It is alternatively or additionally possible for the top of the potting material to be shaped as a paraboloidal or hyperboloidal reflector.

An optoelectronic semiconductor component described herein is explained in greater detail below by way of examples with reference to the Drawings. Elements which are the same in the individual figures are indicated with the same reference numerals. The relationships between the elements are not shown to scale, however, but rather individual elements may be shown exaggeratedly large to assist in understanding.

FIG. 1 shows a schematic sectional representation of an example of an optoelectronic semiconductor component 1. The semiconductor component 1 contains a carrier 2 which comprises a cavity 25. Conductor tracks of the carrier 2 are not illustrated in the Drawings. A base surface of the cavity 25 constitutes a carrier top 20. An optoelectronic semiconductor chip 3 is applied to the carrier top 20. The semiconductor chip 3 comprises a semiconductor layer sequence 32 with an active layer to generate electromagnetic radiation when the semiconductor chip 3 is in operation. The semiconductor chip 3 moreover comprises a radiation-transmissive substrate 34, on which the semiconductor layer sequence 32 is mounted. In the Drawings, the semiconductor layer sequence 32 and the radiation-transmissive substrate 34 are in each case separated schematically by a dashed line. The semiconductor chip 3 is, however, a single, compact, monolithic element which may be handled as a unit and in particular is mounted as a unit on the carrier top 20.

The semiconductor chip 3 is contacted via electrical connector 5, which according to FIG. 1 take the form of bonding wires. The connector 5 connects electrical connection zones 7a on the carrier top 20 to electrical connection zones 7b on a main radiation side 30 of the semiconductor chip 3.

In the lateral direction, parallel to the carrier top 20, the semiconductor chip 3 is directly surrounded by a reflective potting material 4, which starts from the carrier top 20 and extends to the main radiation side 30. When the semiconductor chip 3 is turned off, the potting material 4 appears white to an observer. The potting material 4 terminates flush with the main radiation side 30 in a direction away from the carrier top 20. Apart from a slight variation in thickness due to wetting effects of the semiconductor chip 3 and of lateral boundary walls of the cavity 25, the potting material 4 is of a constant height. In other words, the potting material top 40 remote from the carrier top 20 is oriented substantially parallel to the carrier top 20. Between the carrier top 20 and the potting material top 40, the connector 5 is directly and form-fittingly surrounded in the lateral direction by the potting material 4.

A conversion medium 6 with a conversion medium top 60 is applied with a substantially constant layer thickness to the potting material top 40. The conversion medium top 60 extends virtually at a constant distance from the potting material top 40. The connector 5 is only partially embedded in the conversion medium 6. The connector 5 projects above the conversion medium top 60 in a direction away from the carrier top 20. The entire main radiation side 30 is completely covered by the conversion medium 6, together with the connector 5. The conversion medium 6 only partially fills the cavity 25 such that a space remains in the cavity 25 on the side of the conversion medium top 60 remote from the carrier 2.

The reflective potting material 4 is preferably, as also in all the other examples, a polymer filled with particles having a reflective action. The polymer of the potting material 4 which forms a matrix for the particles is, for example, a silicone, an epoxide or a silicone-epoxy hybrid material. The reflective particles are produced from or consist of, for example, a metal oxide such as alumina or titanium oxide, a metal fluoride such as calcium fluoride or a silicon oxide. The average particle diameter, for example, a median diameter $d_{50}$ in $Q_0$, is preferably 0.3 µm to 5 µm. The proportion by weight of the particles in the entire potting material 4 preferably is 5% to 50%, in particular 10% to 30%. The particles have a reflective action due to their preferably white color and/or due to their refractive index difference relative to the matrix material.

FIG. 2 shows schematic side views of semiconductor chips 3 for semiconductor components 1. The semiconductor chips 3 shown in FIGS. 2A to 2E may be used in a similar manner in all the examples of the semiconductor component 1.

The semiconductor chip 3 according to FIG. 2A comprises the two electrical connection zones 7b on the main radiation side 30 on the semiconductor layer sequence 32. Lateral boundary faces of the semiconductor chip 3 are oriented substantially perpendicularly to the main radiation side 30. The substrate 34 is, for example, a sapphire substrate.

According to FIG. 2B, the substrate 34 comprises a base zone with a reduced diameter and a top zone with an enlarged diameter, wherein the semiconductor layer sequence 32 is mounted on the top zone. Electrical contacting proceeds via the connection zones 7b on the mutually facing main sides of the semiconductor chip 3.

In the semiconductor chip 3 according to FIG. 2C, the connection zones 7 are applied on the semiconductor layer sequence 32 on the main radiation side 30. The width of the semiconductor chip 3 declines in a direction away from the main radiation side. The semiconductor chip 3, for example, has the shape of a truncated pyramid.

In the semiconductor chip 3 according to FIG. 2D, the connection zones 7b, unlike in FIG. 2C, are mounted on mutually facing main sides of the semiconductor chip 3. The substrates 34 of the semiconductor chips 3 according to FIGS. 2B to 2D are in particular silicon carbide substrates.

In FIG. 2E, the semiconductor chip 3 is provided with more than two electrical connection zones 7b on the semiconductor layer sequence 32. The semiconductor chip 3 according to FIG. 2E is designed to be mounted on the carrier 2 in such a manner that the semiconductor layer sequence 32 is located between the carrier 2, not shown in FIG. 2E, and the substrate 34. The main radiation side 30 is formed by the major face of the substrate 34 remote from the semiconductor layer sequence 32.

In the example according to FIG. 3, the reflective potting material 4 has, unlike in FIG. 1, a wetting action relative to the lateral boundary walls of the cavity 25. In this way, the potting material 4 forms a paraboloidal reflector within the cavity 25. The layer thickness of the conversion medium 6 is approximately constant across the entire potting material 4.

In the example of the semiconductor component 1 according to FIG. 4, the electrical connector 5 is completely embedded in the conversion medium 6 together with the potting material 4. The connector 5 does not project above the conversion medium 6. As also in FIGS. 1 and 3, in a direction away from the carrier top 20, the potting material 4 and the semiconductor chip 3 are completely covered by the conversion medium 6 or completely covered by the conversion medium 6 together with the connector 5. The conversion medium 6 is optionally, in particular completely, covered by an additional potting compound 8, wherein the additional potting compound does not project above the cavity 25. The additional potting compound 8 may, as also in all the other examples, be clear and transparent or also contain a filter medium and/or a diffuser.

In the example of the semiconductor component 1 according to FIG. 5, the additional potting compound 8 is shaped as a lens. The conversion medium 6 takes the form of a wafer and is limited to the main radiation side 30. Unlike the illustration in FIG. 5, the conversion medium 6 may comprise recesses or openings for the connector 5.

The electrical connection zones 7 on the carrier top 20 are shielded by the reflective potting material 4 from radiation generated when the semiconductor chip 3 is in operation and is coupled out from the semiconductor chip 3. It is in this way possible for the connection zones 7 to comprise a material which absorbs the radiation generated in the semiconductor chip 3. For example, the connection zones 7 comprise corrosion-resistant gold or a gold alloy.

It is optionally possible, as also in all the other examples, for a mirror 10 to be located between the semiconductor chip 3 and the carrier top 20. The mirror 10, for example, comprises or consists of a reflective metal such as silver. The mirror 10 may alternatively or additionally at least in part reflect by total reflection.

FIG. 6 shows an example of the semiconductor component 1 in which the carrier 2 does not comprise a cavity but is instead shaped as a plane-parallel sheet. The conversion medium 6 takes the form of a wafer and is applied to the main radiation side 30, wherein the connection zones 7 of the conversion medium 6 are not covered. In a direction away from the carrier top 20, the potting material 4 terminates flush with the conversion medium 6. In the lateral direction, the conversion medium 6 and the potting material 7 are in direct contact with one another all round. The connection zones 7 are completely covered by the potting material 4. Unlike the illustration in FIG. 6, it is possible for the connector 5 not to project above the potting material 4 in a direction away from the carrier top 20 and to be completely embedded in the potting material 4.

In the example according to FIG. 7, the connector 5 is produced by coatings directly on the semiconductor chip 3. A via between the connector 5 and the semiconductor chip 3 passing through the conversion medium 6 is not illustrated in FIG. 7. The semiconductor chip 3 preferably comprises an electrically insulating layer at least on lateral boundary faces to avoid electrical short circuits.

According to FIGS. 6 and 7, the additional potting compound 8 follows on from the semiconductor chip 3 and the conversion medium 6 and the potting material 4 in a direction away from the carrier 2. The additional potting compound 8 comprises a lens-shaped zone which extends over part of the additional potting compound 8, see FIG. 6, or over the entire additional potting compound 8, as in FIG. 7.

FIG. 8A shows a sectional representation and FIG. 8B a plan view of a further example of the semiconductor component 1. Parts of the potting material 4 are located in the lateral direction between the connector 5 and the semiconductor chip 3. Insulation between the semiconductor chip 3 and the connector 5 is thus provided in the lateral direction by the potting material 4. The connector 5 is applied directly to the potting material 4 and the conversion medium 6 and electrically connected to the semiconductor chip 3 and the carrier 2 by means of vias.

In the example according to FIG. 9, the potting material 4 does not reach as far as the semiconductor layer sequence 32. The conversion medium 6 takes the form of volume potting and preferably has a thickness of 100 μm to 500 μm. Unlike the illustration in FIG. 9, it is possible for the conversion medium 6 to project above the cavity 25.

In the example according to FIG. 10, the conversion medium 6 completely fills the cavity 25 of the carrier 2 and terminates flush with the carrier 2 in a direction away from the carrier top 20.

According to FIG. 11, the conversion medium 6 is applied directly as a layer or indirectly as a wafer via connecting means (not shown), in particular by adhesive bonding, to the main radiation side 30. Both the semiconductor chip 3 and the conversion medium 6 are completely covered by the potting material 4, in a direction away from the carrier 2. In other words, the semiconductor chip 3 and the conversion medium 6 are completely enclosed all round by the carrier 2 and the potting material 4. The layer thickness of the potting material 4 over the conversion medium 6 is preferably small and amounts, for example, to at most 50 μm such that radiation from the semiconductor chip 3 and converted radiation from the conversion medium 6 is able to leave the potting material 4 in the region over the main radiation side 30 of the semiconductor component 1.

FIGS. 12A and 12B show components without potting material. As in all the examples, the semiconductor components 1 may comprise protection diodes 9 for protection against electrostatic discharges. In the example according to FIG. 13, the semiconductor components 1 from FIGS. 12A and 12B are shown with the potting material 4. The connector 5 is only incompletely covered by the potting material 4, while the protection diode is embedded in the potting material 4. The semiconductor chip 3 and the conversion medium 6 are likewise free of potting material 4. The potting material 4 extends around the semiconductor chip 3 up to the boundary walls of the cavity.

FIG. 14 plots intensity of emission I against emission angle α for the components according to FIG. 12, see curve A, and for semiconductor component 1 according to FIG. 13, see curve B. Thanks to the reflective potting compound 4, the semiconductor component 1 has a narrower emission angle range in comparison with an identical component without potting material.

Figure 15:
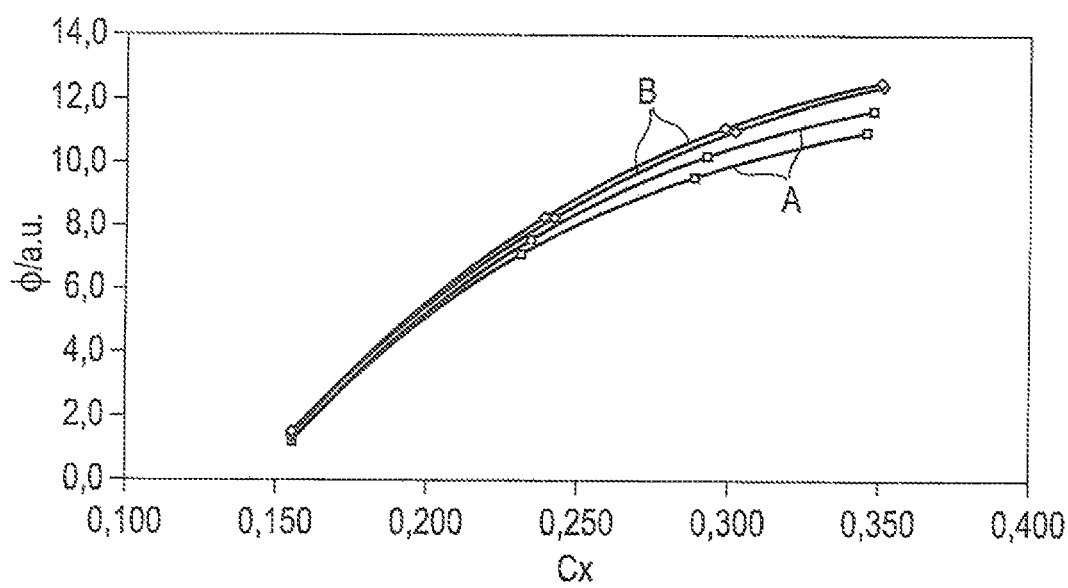

FIG. 15 plots luminous flux Φ in arbitrary units against a color coordinate $c_x$ of the CIE standard chromaticity diagram. The curves A correspond to components without potting material, while the curves B correspond to semiconductor components 1 with the potting material 4. The luminous flux Φ is raised by a number of percentage points in the curves B relative to the curves A. The efficiency of the semiconductor component 1 may thus be increased by the potting material 4.

Our components described herein are not restricted by the description given with reference to the examples. Rather, this disclosure encompasses any novel feature and any combination of features, including in particular any combination of features in the appended claims, even if the feature or combination is not itself explicitly indicated in the claims or examples.

The invention claimed is:

1. An optoelectronic semiconductor component comprising:
   a carrier with a carrier top,
   at least one optoelectronic semiconductor chip mounted on the carrier top and having a radiation-transmissive substrate and a semiconductor layer sequence which comprises at least one active layer that generates electromagnetic radiation,
   a conversion medium that converts radiation generated when the semiconductor chip is in operation partially or completely into radiation of another wavelength, wherein the conversion medium is applied on a main radiation side of the semiconductor chip remote from the carrier top, and
   a reflective potting material,
   wherein, starting from the carrier top, the potting material completely surrounds the semiconductor chip in a lateral direction and projects beyond the semiconductor chip, in a direction away from the carrier top,
   wherein the conversion medium is located between the main radiation side and the potting material so that both the semiconductor chip and the conversion medium are completely covered by the potting material when seen in top view,
   wherein the potting material directly and form-fittingly surrounds the semiconductor chip and the conversion medium in the lateral direction,
   wherein a layer thickness of the potting material over the conversion medium is at most 50 µm,
   wherein a fraction of the radiation generated in the semiconductor chip when in operation leaves the substrate in the lateral direction and penetrates by at most 300 µm into the potting material, and
   wherein the potting material reflects at least some of the fraction of radiation diffusely back into the substrate.

2. The optoelectronic semiconductor component according to claim 1, wherein the substrate is located between the carrier and the semiconductor layer sequence, and, starting from the carrier top, the potting material extends beyond a main radiation side of the semiconductor chip remote from the carrier.

3. The optoelectronic semiconductor component according to claim 1,
   wherein an electrical connection is produced between the carrier and the main radiation side of the semiconductor chip by at least one electrical connector, and
   the at least one connector is embedded at least in places in the potting material.

4. The optoelectronic semiconductor component according to claim 3, wherein the potting material at least in places directly and form-fittingly surrounds the semiconductor chin and the at least one electrical connector in the lateral direction.

5. The optoelectronic semiconductor component according to claim 1,
   wherein, on the carrier top laterally beside the semiconductor chip, electrical connection zones comprise a material which absorbs the radiation generated when the semiconductor chip is in operation, and
   the electrical connection zones are shielded from the radiation by the potting material.

6. The optoelectronic semiconductor component according to claim 1, wherein the potting material reduces an emission angle of the radiation generated when the semiconductor chip is in operation.

7. The optoelectronic semiconductor component according to claim 1,
   wherein the potting material comprises a radiation-transmissive matrix material and reflective particles embedded in the matrix material, and
   the matrix material contains or consists of a silicone and/or an epoxide and the particles contain or consist of at least one metal oxide.

8. The optoelectronic semiconductor component according to claim 1, wherein the radiation-transmissive substrate is a growth substrate for the semiconductor layer sequence.

9. An optoelectronic semiconductor component comprising:
   a carrier with a carrier top,
   at least one optoelectronic semiconductor chip mounted on the carrier top and having a radiation-transmissive substrate and a semiconductor layer sequence which comprises at least one active layer that generates electromagnetic radiation,
   a conversion medium that converts radiation generated when the semiconductor chip is in operation partially or completely into radiation of another wavelength, wherein the conversion medium is applied on a main radiation side of the semiconductor chip remote from the carrier top, and
   a reflective potting material comprising a matrix and reflective particles, the matrix comprising silicone, an epoxide or a silicone-epoxy hybrid material and the reflective particles comprising alumina or titanium oxide or calcium fluoride and having an average particle diameter of 0.3 µm to 50 µm and wherein the reflective particles are in an amount of 10% to 30% by weight of the potting material,
   wherein the potting material completely surrounds the semiconductor chip in a lateral direction and projects beyond the semiconductor chip, in a direction away from the carrier top,
   wherein the conversion medium is located between the main radiation side and the potting material so that both the semiconductor chip and the conversion medium are completely covered by the potting material when seen in top view,
   wherein the potting material directly and form-fittingly surrounds the semiconductor chip and the conversion medium in the lateral direction,
   wherein a layer thickness of the potting material over the conversion medium is at most 50 µm,
   a fraction of the radiation generated in the semiconductor chip when in operation leaves the substrate in the lateral direction and penetrates by at most 300 µm into the potting material, and the potting material reflects at least some of the fraction of radiation diffusely back into the substrate.

10. The optoelectronic semiconductor component according to claim 1, the potting material and the carrier terminate flush in a lateral direction so that only the carrier and the potting material form lateral faces of the component and have the same lateral dimensions and wherein the carrier top is of planar shape.

* * * * *

UNITED STATES PATENT AND TRADEMARK OFFICE
CERTIFICATE OF CORRECTION

| | | |
|---|---|---|
| PATENT NO. | : 8,860,062 B2 | Page 1 of 1 |
| APPLICATION NO. | : 13/809292 | |
| DATED | : October 14, 2014 | |
| INVENTOR(S) | : Schneider et al. | |

It is certified that error appears in the above-identified patent and that said Letters Patent is hereby corrected as shown below:

In the Claims

Column 9, claim 4, line 59, please change "chin" to --chip--.

Signed and Sealed this
Seventeenth Day of March, 2015

Michelle K. Lee
*Director of the United States Patent and Trademark Office*